United States Patent [19]
Relph

[11] Patent Number: 6,046,620
[45] Date of Patent: Apr. 4, 2000

[54] PROGRAMMABLE DELAY LINE

[75] Inventor: Richard Relph, Clara, Calif.

[73] Assignee: Advanced Micro Devices, Inc., Sunnyvale, Calif.

[21] Appl. No.: 08/992,962

[22] Filed: Dec. 18, 1997

[51] Int. Cl.[7] ............................................. H03H 11/26
[52] U.S. Cl. .................... 327/277; 327/278; 327/281; 327/284; 327/285
[58] Field of Search ................................. 327/276, 277, 327/278, 281, 284, 285, 288

[56] References Cited

U.S. PATENT DOCUMENTS

| | | | |
|---|---|---|---|
| 5,012,143 | 4/1991 | Boudewijns | 327/277 |
| 5,132,572 | 7/1992 | Woo | 326/73 |
| 5,216,302 | 6/1993 | Tanizawa | 327/277 |
| 5,220,216 | 6/1993 | Woo | 327/278 |
| 5,227,679 | 7/1993 | Woo | 327/269 |
| 5,233,637 | 8/1993 | Koerner et al. | 327/172 |
| 5,237,224 | 8/1993 | DeLisle et al. | 327/276 |
| 5,243,227 | 9/1993 | Gutierrez, Jr. et al. | 327/277 |
| 5,264,745 | 11/1993 | Woo | 326/62 |
| 5,283,631 | 2/1994 | Koerner et al. | 327/393 |
| 5,349,612 | 9/1994 | Guo et al. | 327/270 |
| 5,363,419 | 11/1994 | Ho | 375/120 |
| 5,367,542 | 11/1994 | Guo | 327/271 |
| 5,400,370 | 3/1995 | Guo | 375/118 |
| 5,438,300 | 8/1995 | Saban et al. | 331/16 |
| 5,444,406 | 8/1995 | Horne | 327/277 |
| 5,446,417 | 8/1995 | Korhonen et al. | 327/276 |
| 5,452,333 | 9/1995 | Guo et al. | 327/175 |
| 5,457,336 | 10/1995 | Fang et al. | 257/322 |
| 5,457,719 | 10/1995 | Guo et al. | 327/9 |
| 5,744,991 | 4/1998 | Jefferson et al. | 327/158 |
| 5,757,218 | 5/1998 | Blum | 327/175 |

*Primary Examiner*—Tim Callahan
*Assistant Examiner*—Cassandra Cox

[57] ABSTRACT

A programmable delay line has delay elements that are responsive to at least one of two different calibration signals for varying their drive power characteristics and hence the delay period. Preferably, there are two sets of delay elements, responsive to a respective calibration signal, with one set comprising much fewer delay elements than the other set. The delay elements may be responsive to a digital calibration signal for discrete control, an analog calibration signal for continuous control, or both.

6 Claims, 5 Drawing Sheets

Figure (5c)

PROGRAMMABLE DELAY LINE

TECHNICAL FIELD

The present invention relates to delay lines and more particularly to programmable delay lines.

BACKGROUND ART

The commonly assigned U.S. Pat. No. 5,349,612, entitled "Digital Serializer and Time Delay Regulator," issued to Bin Guo and James J. Kubinec on Sep. 30, 1994 discloses inter alia a technique for programming the delay time of a novel delay line implementation. Referring to FIG. 1 herein, as described in that application, a programmable delay line 100 comprises two serially coupled sections 110 and 120 of delay elements. Each delay element in both sections is configured to have a common delay time ($T_d$).

A fixed-stage delay section 110 comprises K delay elements 112-1, 112-2, to 112-K coupled in series. A variable-stage delay section 120 comprises M serially coupled delay elements 122-1, 122-2, to 122-M having outputs connected to inputs of a multiplexer 124. In response to a digital command code, the multiplexer 124 selects one of the outputs of the M delay elements 122-1 to 122-M. If the digital command code is set to select the output of the ith delay element (122-i), then the total delay time of the programmable delay line ($T_{tot}$) may be computed as follows: where $T_{mux}$ is the delay time through the multiplexer 124, assuming that all the paths through the multiplexer 124

$$T_{tot} = K(T_d) + i(T_d) + T_{mux}$$
$$= T_k + i(T_d)$$

have the same delay time. The total delay time of the programmable delay line 100 thus has a fixed delay component $T_k$, equal to $K(T_d)+T_{mux}$, and a variable delay component $i(T_d)$.

While the programmable delay line disclosed in Guo and Kubinec is believed adequate in its implementation, there are aspects of that delay line that may be disadvantageous in other implementations. For example, the programmable delay line 100 employs a multiplexer 124, which consumes space on the semiconductor substrate. In addition, the assumption that the delay times of each path through the multiplexer 124 is the same may be false.

The programmable delay line 100 may have a large fixed delay Home component, making it difficult to achieve short delay times. Since the programmable delay line 100 uses delay elements 112 and 122 having a common delay period, the resolution of the programmable delay line 100 is limited to the common delay period. If the resolution is improved by coupling the programmable delay line 100 to another programmable delay line having delay elements with a shorter common delay period, then an additional area of the substrate is used up for a second multiplexer.

DISCLOSURE OF THE INVENTION

There is a need for a programmable delay line that can support fine adjustments in its delay period, i.e., smaller than the delay of any one constituent delay element. There is also a need for a programmable delay line that can support short delay periods. In addition, there exists need for a programmable delay line that does not require a multiplexer.

These and other needs are met by the present invention, in which a programmable delay line has delay elements responsive to at least one of two different calibration signals for varying their drive power characteristics. The programmable delay line thus allows fine control over the delay period by adjusting a single or a few delay elements separately from the remaining delay elements. Moreover, fine control is also available through a continuous control signal.

According to one aspect of the invention, a programmable delay line comprises a chain of serially coupled, adjustable delay elements. One or more of the adjustable delay elements comprise respective first adjustable delay elements, which are each responsive to a first calibration signal for varying a common first driving power characteristic of the first adjustable delay elements. At least some of the other adjustable delay elements, Comprising respective second adjustable delay elements, are each responsive to a second calibration signal, different from the first calibration signal, for varying a common second driving power characteristic of the second adjustable delay elements.

Preferably, the number of the first adjustable delay elements is much less than the number of the second adjustable delay elements, for example, at a ratio of eight to one. Alternatively, there may only be a single first adjustable delay element.

Either the first, the second, or both sets of adjustable delay elements may include two or more inverters coupled in parallel, at least one of which is responsive to either or both of the first or second calibration signals to be enabled and hence vary the driving power characteristic of the delay element.

Moreover, either the first, the second, or both sets of adjustable delay elements may include a load transistor, responsive to either or both of the first or second calibration signals and coupled between a source electrode of an NMOS transistor of the adjustable delay element and a ground potential for varying the driving characteristic of the delay element.

Additional objects, advantages, and novel features of the present invention will be set forth in part in the detailed description which follows, and in part will become apparent upon examination or may be learned by practice of the invention. The objects and advantages of the invention may be realized and obtained by means of the instrumentalities and combinations particularly pointed out in the appended claims.

BRIEF DESCRIPTION OF DRAWINGS

The present invention is illustrated by way of example, and not by limitation, in the figures of the accompanying drawings, wherein elements having the same reference numeral designations represent like elements throughout and wherein:

FIG. 5(c) is a diagram of an adjustable inverter of the delay element depicted in FIG. 5(a).

BEST MODE FOR CARRYING OUT THE INVENTION

A programmable delay line is described. In the following description, for purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

PROGRAMMABLE DELAY LINE WITH COARSE & FINE CONTROL

Figure 1:
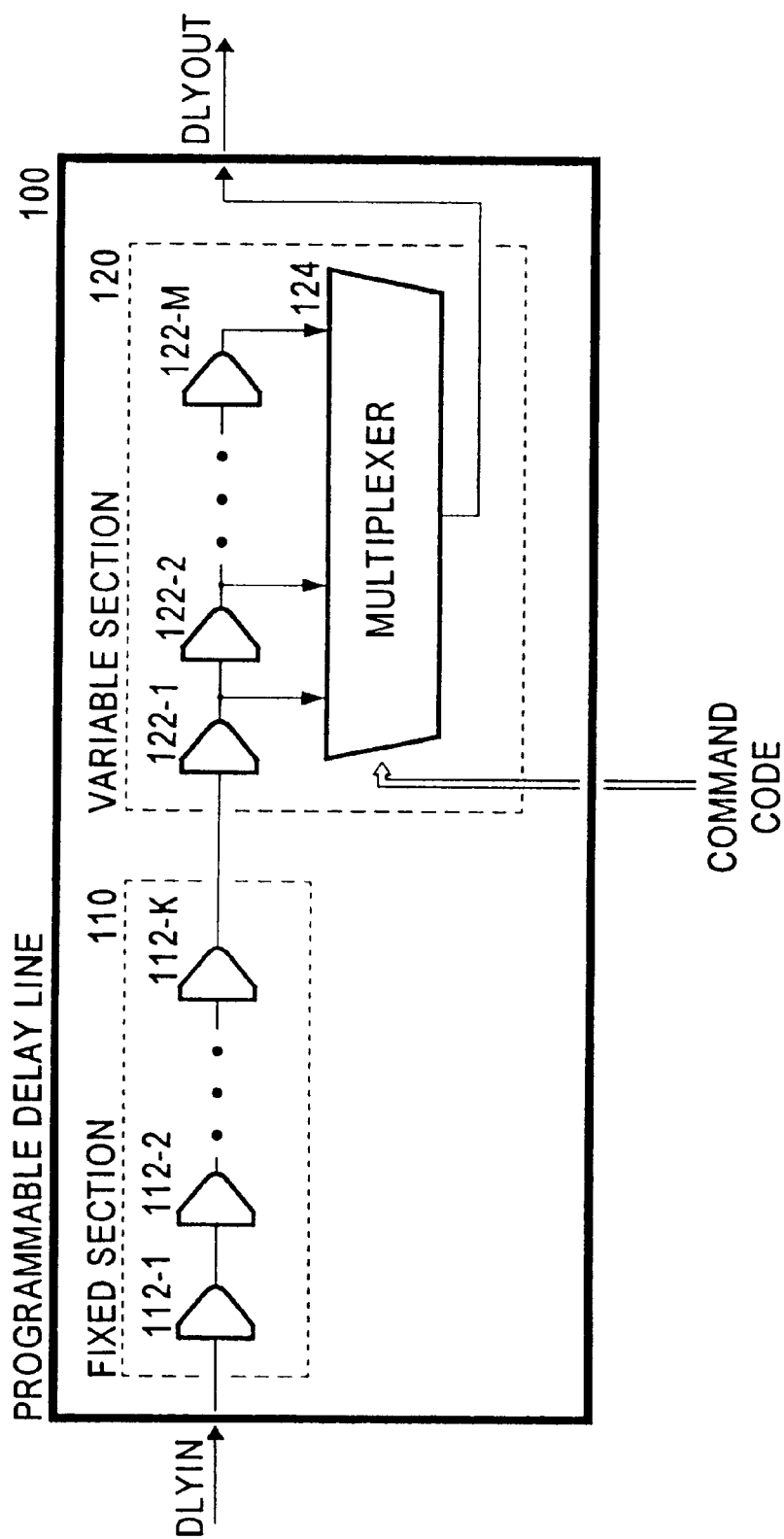
FIG. 1 is a circuit diagram of a previously developed programmable delay line.
Figure 2A:
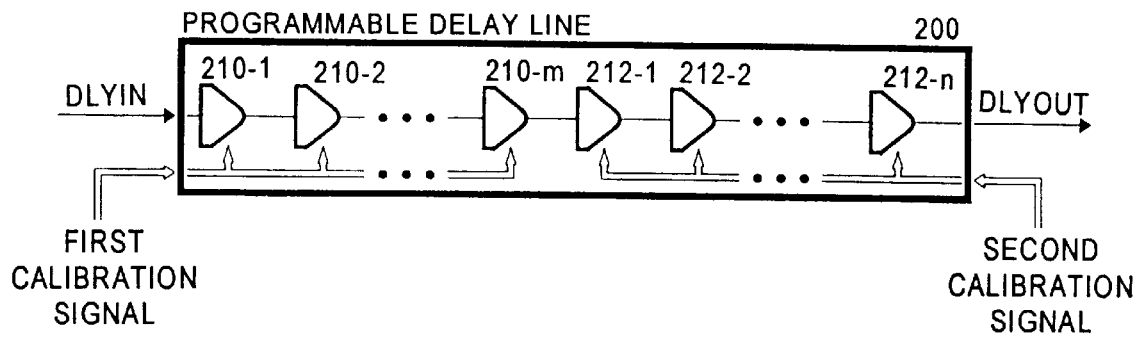
FIG. 2(a) is a circuit diagram of a programmable delay line according to one embodiment of the present invention.

Referring to FIG. 2(a), a programmable delay line 200 according to one embodiment of the invention comprises delay elements 210 and 212 coupled in series. The delay elements 210 and 212 are responsive to a respective calibration signal for adjusting their common delay period thereof. Specifically, programmable delay line 200 comprises a first set of delay elements 210-1, 210-2, to 210-m responsive to a first calibration signal and a second set of delay elements 212-1, 212-2, to 212-n responsive to a second calibration signal. Although FIG. 2(a) depicts a programmable delay line 200 with delay elements of each set grouped together, it is to be understood that the specific arrangement of the delay elements may be in any order and even interlaced, e.g. every other delay element of one set disposed after every other delay element of the other set.

In the arrangement depicted in FIG. 2(a), fine control may be attained by limiting the number of delay elements in one set to a small number, even one. For example, a programmable delay line 200 may comprise eight (8) delay elements in the first set of delay elements, each delay element being responsive to the first calibration signal, i.e. m=8, and a single delay element in the second set responsive to the second calibration signal, i.e. n=1. Thus, the first calibration signal provides for coarse control over the delay period of the programmable delay line 200, and the second calibration signal provides for fine control over the delay period of the programmable delay line 200, since there is a 8:1 ratio of delay elements controlled by the respective calibration signals. Other ratios, of course, such as 10:1, 20:1, and higher can be implemented.

Figure 2B:
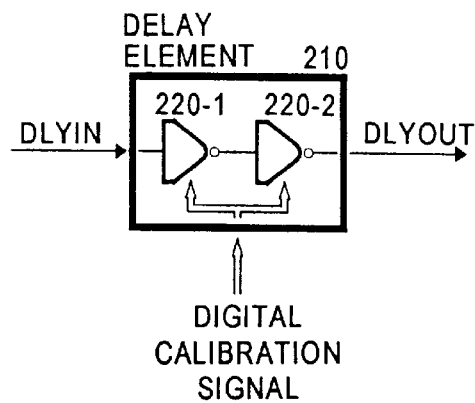
FIG. 2(b) is a circuit diagram of a delay element in FIG. 2(a).
Figure 2C:
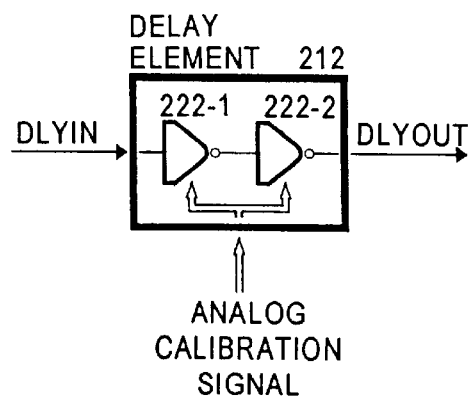
FIG. 2(c) is a circuit diagram of another delay element in FIG. 2(a).

Referring to FIGS. 2(b) and 2(c), delay elements 210 and 212 Preferably comprise two (2) adjustable inverters 220 and 222, respectively, coupled in series. According to one implementation, each set of delay elements uses delay elements of a similar structure, merely controlled by two respective calibration signals, which can represent different values. According to other implementations, however, further control over the delay period of the programmable delay line 200 may be achieved by employing sets of different kinds of delay elements 210 and 212, controlled not only by different calibration signals, but by different kinds of calibration signal. For example, one kind of calibration signal can be a digital signal, as depicted in FIG. 2(b), for providing discrete control over a delay element, and another kind of calibration signal can be an analog voltage for exercising continuous control over a delay element, as depicted in FIG. 2(c).

ADJUSTABLE DELAY ELEMENT WITH DISCRETE CONTROL

Figure 3A:
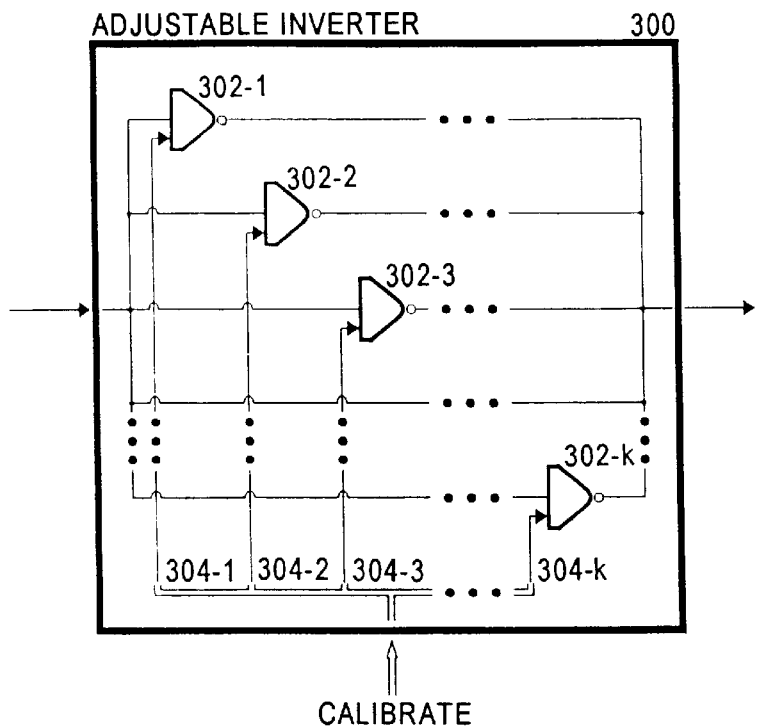
FIG. 3(a) is a diagram of an adjustable inverter of FIG. 2(b) according to one embodiment of the present invention.

According to one implementation, a delay element comprises two serially coupled adjustable inverters 300, one of which depicted in FIG. 3(a), for providing discrete control over the delay period thereof according to a digital calibration signal. Specifically, each adjustable inverter 300 comprises a plurality of switchable inverters 302-1, 302-2, 302-3, to 302-k coupled in parallel. Each switchable inverter 302 is enabled and disabled in response to a single bit 304-1, 304-2, 304-3, to 304-k of the digital calibration signal, e.g. by pass-trough transistors (not shown) coupled to $V_{CC}$ and $V_{SS}$ power supply inputs of each switchable inverter 302.

The delay period of an inverter is inversely related to the driving power of the inverter. By switching in greater or fewer switchable inverters of the adjustable inverter, the driving power of the adjustable inverter is increased and decreased respectively, causing a respective shortening and lengthening in the delay period of the adjustable inverter, and hence of the delay element. Since each switchable inverter 302 contributes a discrete amount of driving power to the adjustable inverter in response to a bit of the digital calibration signal, the digital calibration signal accordingly allows for control of the delay period in discrete amounts.

On one hand, when each switchable inverter 302 is designed according to the same structure, i.e. same channel lengths and gates, only the number of enabled, switchable inverters 302 determines the delay period. On the other hand, when the sizes of components the switchable inverters 302 are different, then a particular combination of switchable inverters 302 may correspond to a respective delay period, increasing the number of different, digitally programmable delay periods.

Figure 3B:
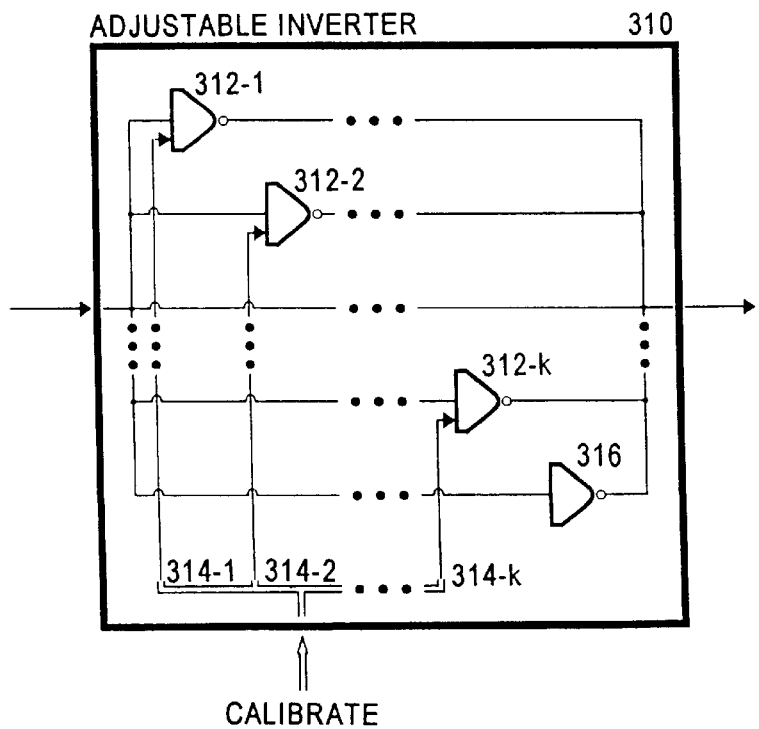
FIG. 3(b) is a diagram of an adjustable inverter of FIG. 2(c) according to one embodiment of the present invention.

If all the switchable inverters 302 coupled in parallel are disabled in response to the calibration signal, then the delay element ceases to function. Such a configuration consequently does not use a possible value of a digital calibration signal. In an implementation depicted in FIG. 3(b), however, adjustable inverter 310 comprises at least one parallel-coupled static inverter 316 that is always enabled, in addition to the plurality of switchable inverters 312-1, 312-2, to 312-k, responsive to a respective bit 314-1, 314-2, to 314-k, of the calibration signal. In this configuration, the adjustable inverter 310 is always enabled, via staff inverter 316, allowing all of the possible values of the digital calibration signal to be used. More information about this latter configuration may be found in the commonly assigned U.S. Patent No. 5,220,216 entitled "Programmable Driving Power of a CMOS Gate" issued on Jun. 15, 1993 to Ann K. Woo.

By controllably enabling or disabling switchable inverters coupled in parallel, the driving power of the adjustable inverter can be programmed. Programming the driving power of the adjustable inverter advantageously allows the delay period of the adjustable inverter to be programmable at a resolution smaller than that of a single inverter, since each switchable inverter contributes a fraction of the total driving power of the adjustable inverter.

ADJUSTABLE DELAY ELEMENT WITH CONTINUOUS CONTROL

Figure 4:
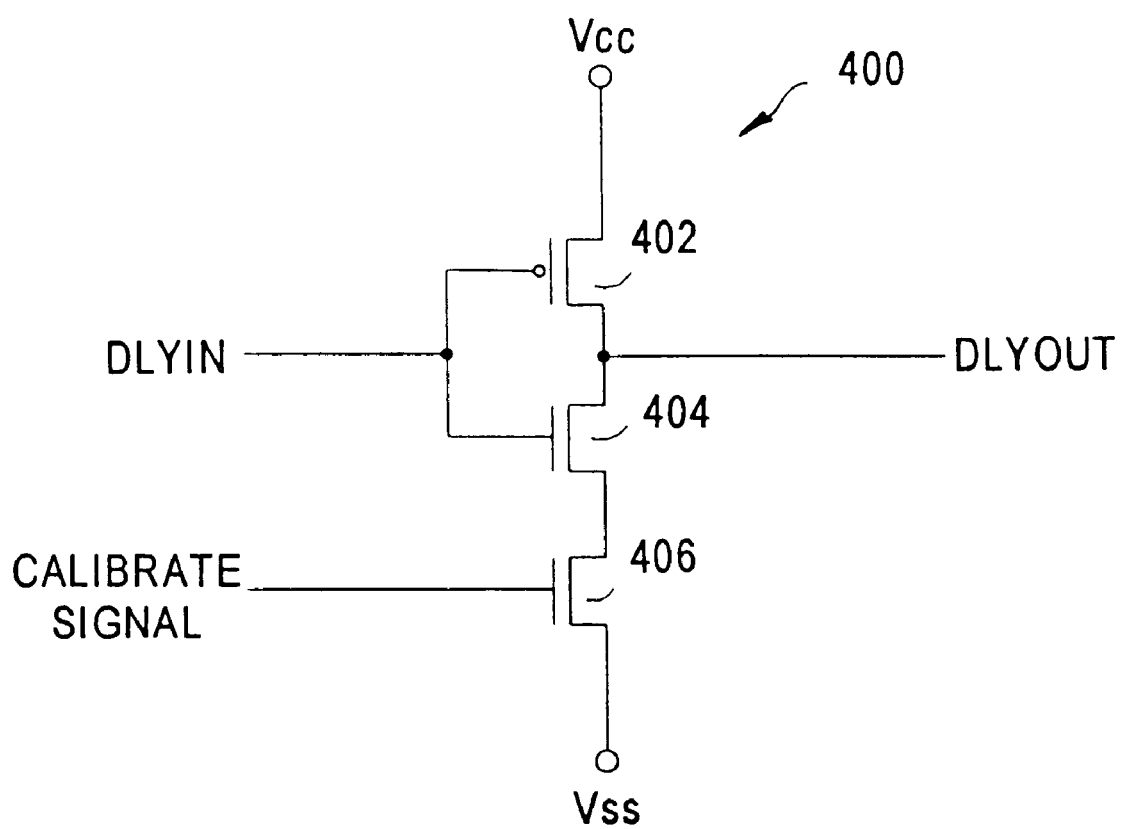
FIG. 4 is a diagram of an adjustable inverter of FIG. 2(b) according to another embodiment of the present invention.

According to another implementation, a delay element comprises two serially coupled adjustable inverters 400, one of which is depicted in FIG. 4, for providing continuous control over the delay period thereof according to an analog calibration signal. Specifically, each adjustable inverter 400 comprises a PMOS transistor 402 and an NMOS transistor 404, coupled in a conventional arrangement. In addition, adjustable inverter 400 comprises a load transistor 406 coupled between the source electrode of the NMOS transistor 404 and a ground potential appropriate for the technology, $V_{SS}$. The gate of the load transistor 406 receives an analog voltage as a calibration signal.

In a generally digital implementation, the analog voltage may be controlled through an analog-to-digital converter (not shown), designed to produce analog voltage with fine resolution within an appropriate range. The load transistor 406 is configured so that fine changes in the gate voltage cause fine changes in the drain voltage of the load transistor along a conduction path between its source and drain, and hence in the driving power of the conventional CMOS portion of the adjustable inverter. Consequently, the delay period of the adjustable inverter 400 can be finely and continuously controlled by an analog calibration signal.

The load transistor 406 may be implemented according to a variety of techniques known in the art, but does not depend on any particular implementation. For example, the load transistor 406 may comprise an enhancement transistor Accordingly, the load transistor 406 may be controlled by an analog gate voltage set at a potential sufficient to put the load transistor 406 into linear mode, e.g. at a gate voltage greater than the sum of the drain voltage and the threshold voltage. On the other hand, the load transistor 406 may comprise a depletion transistor, an enhancement-depletion transistor, or any other controllable load device including but not limited to a variable resistor.

By controlling an analog calibration signal applied to the gate electrode of a load transistor coupled to a ground potential, fine changes in the driving power of the adjustable inverter 400 may be attained. Consequently, the delay period of the adjustable inverter 400 can advantageously be programmed at a resolution smaller than the overall delay period of the device.

PROGRAMMABLE DELAY LINE WITH DUAL CONTROL

As evident from the configuration of programmable delay line 200, the programmable delay line 200 may be subject to discrete control, continuous control, or both. For example, if both sets of delay elements 210 and 212 are implemented with adjustable inverters 300, then the entire programmable delay line 200 is subject to digital, discrete control. Fine control in this arrangement is attained by keeping the number of adjustable inverters 300 of one set, e.g. the set of delay elements 212, much smaller than the number of adjustable inverters 300 of the other set, e.g. the set of delay elements 210. In fact, the smaller set may comprise a single delay element.

In another arrangement, the entire programmable delay line 200 may be subject to continuous control according to an analog calibration voltage. In this arrangement, both sets of delay elements 210 and 212 are implemented with adjustable inverters 400. Fine control is attained either by fine control over the analog calibration voltage, or by constructing the programmable delay line 200 with much fewer delay elements in one set than in the other set.

The different types of control, discrete and continuous, may be mixed within a programmable delay line 200. For example, a first set may be implemented with adjustable inverters 300 that are responsive to a first, digital calibration signal, and the other set implemented with adjustable inverters 400, responsive to a second, analog calibration signal. Fine control, beyond that provided by the analog calibration, over the delay period of the programmable delay line 200 may be attained by making the one set of delay elements comprise much fewer delay elements than the other set.

Figure 5A:
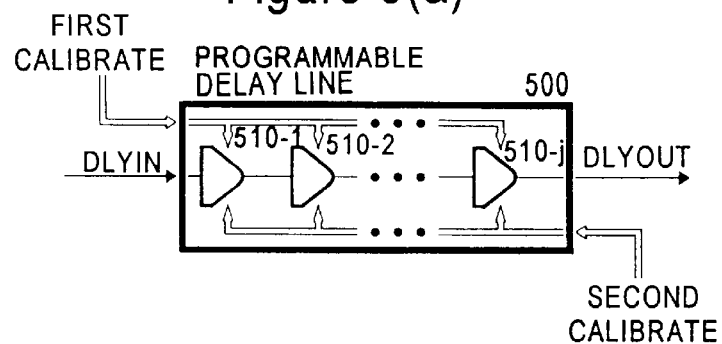
FIG. 5(a) is a circuit diagram of a programmable delay line according to still another embodiment.
Figure 5B:
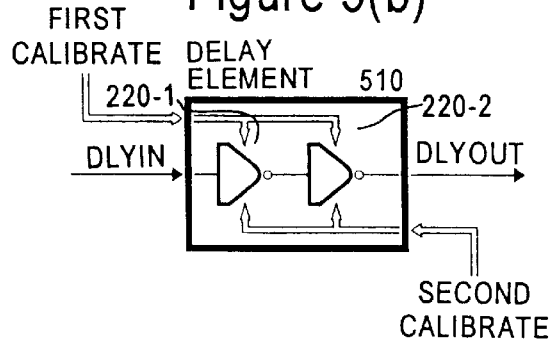
FIG. 5(b) is a diagram of a delay element of the programmable delay line depicted in FIG. 5(a).
Figure 5B:
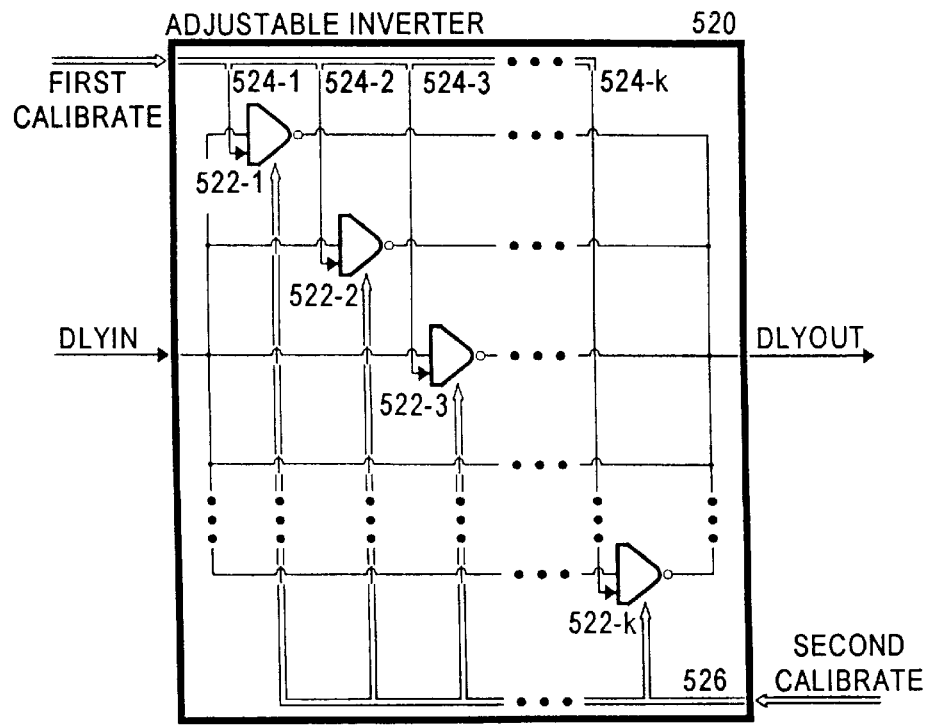

In still another embodiment, with reference to FIG. 5(*a*), each delay element 510-1, 510-2, to 510-j of programmable delay line 500 is responsive to both kinds of calibration signals, i.e. digital and analog. Specifically, referring to FIG. 5(*b*), each delay element 510 comprises two adjustable inverters 520 coupled in series. Each adjustable inverter 520, depicted in FIG. 5(*c*), comprises a plurality of switchable inverters 522-1, 522-2, 522-3, to 522-k, enabled or disabled according to respective bits 524-1, 524-2, 524-3, to 524-k, of a digital, first calibration signal. Each switchable inverter 522-1, 522-2, 522-3, to 522-k is also responsive to a continuous control voltage signal 526, e.g. through a load transistor (not shown). Thus, fine control over programmable delay line 500 may be attained by fine adjustments in an analog, second calibration signal. Moreover, the first calibration signal enables digital control over the entire programmable delay line 500.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A programmable delay line, comprising a chain of serially coupled adjustable delay elements, wherein:

one or more of the adjustable delay elements are each responsive to a first digital calibration signal for adjusting a common first delay period thereof; and at least some of the other adjustable delay elements are each responsive to a second digital calibration signal, other than the first digital calibration, for adjusting a common second delay period thereof, wherein each of said one or more of the adjustable delay elements includes a respective plurality of first inverters coupled in parallel and individually enabled by respective bits of the first digital calibration signal, whereby at least two of the first invertors may be enabled at a same time.

2. The programmable delay line of claim 1, wherein each of said at least some of the other adjustable delay elements includes a respective plurality of second invertors coupled in parallel and individually enabled by respective bits of the second digital calibration signal, whereby at least two of the second invertors may be enabled at a same time.

3. A programmable delay line, comprising a chain of serially coupled adjustable delay elements, wherein:

one or more of the adjustable delay elements are each responsive to an analog calibration signal for adjusting a common first delay period thereof; and at least some of the other adjustable delay elements are each responsive to a digital calibration signal for adjusting a common second delay period thereof;

wherein each of said at least some of the other adjustable delay elements includes a respective plurality of inverters coupled in parallel and individually enabled by respective bits of the digital calibration signals whereby at least two of the invertors can be enabled at a same time.

4. The programmable delay line of claim 3, wherein each of said one or more of the adjustable delay elements includes a respective load transistor coupled along a conduction path to a ground potential and having a gate electrode responsive to the analog calibration signal.

5. A programmable delay line, comprising a chain of serially coupled adjustable delay elements, wherein each of the adjustable delay elements are responsive to an analog calibration signal and a digital calibration signal for adjusting a common delay period thereof;

wherein said each of the adjustable delay elements includes a respective plurality of invertors coupled in parallel and individually enabled by respective bits of the digital calibration signal whereby at least two of the invertors can be enabled at a same time.

6. The programmable delay line of claim 5, wherein each of the adjustable delay elements includes a respective load transistor coupled along a conduction path to a ground potential and having a gate electrode responsive to the analog calibration signal.

* * * * *